(12) United States Patent  
Broberg, III et al.

(10) Patent No.: US 7,430,725 B2
(45) Date of Patent: Sep. 30, 2008

(54) SUITE OF TOOLS TO DESIGN INTEGRATED CIRCUITS

(75) Inventors: Robert Neal Carlton Broberg, III, Rochester, MN (US); Jonathan William Byrn, Kasson, MN (US); Gary Scott Delp, Rochester, MN (US); Michael K. Eneboe, San Jose, CA (US); Gary Paul McClannahan, Rochester, MN (US); George Wayne Nation, Eyota, MN (US); Paul Gary Reuland, Rochester, MN (US); Thomas Sandoval, Los Gatos, CA (US); Matthew Scott Wingren, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 500 days.

(21) Appl. No.: 11/156,319

(22) Filed: Jun. 18, 2005

(65) Prior Publication Data

US 2005/0240892 A1    Oct. 27, 2005

Related U.S. Application Data

(62) Division of application No. 10/335,360, filed on Dec. 31, 2002, now Pat. No. 7,055,113.

(51) Int. Cl.
*G06F 17/50* (2006.01)

(52) U.S. Cl. ............................................. 716/1; 716/18
(58) Field of Classification Search ...................... 716/1, 716/7–11, 16–18
See application file for complete search history.

(56) References Cited

U.S. PATENT DOCUMENTS

| | | | |
|---|---|---|---|
| 5,818,728 A | 10/1998 | Yoeli et al. | |
| 5,818,729 A | 10/1998 | Wang et al. | |
| 6,459,136 B1 | 10/2002 | Amarilio et al. | |

(Continued)

FOREIGN PATENT DOCUMENTS

| JP | 01202397 | 7/2001 |
|---|---|---|
| JP | 02202886 | 7/2002 |

*Primary Examiner*—Paul Dinh
(74) *Attorney, Agent, or Firm*—Eric James Whitesell

(57) ABSTRACT

A set of tools is provided herein that produces useful, proven, and correct integrated semiconductor chips. Having as input either a customer's requirements for a chip, or a design specification for a partially manufactured semiconductor chip, the tools generate the RTL for control plane interconnect; memory composition, test, and manufacture; embedded logic analysis, trace interconnection, and utilization of spare resources on the chip; I/O qualification, JTAG, boundary scan, and SSO analysis; testable clock generation, control, and distribution; interconnection of all of the shared logic in a testable manner from a transistor fabric and/or configurable blocks in the slice. The input customer requirements are first conditioned by RTL analysis tools to quickly implement its logic. The slice definition and the RTL shell provides the correct logic for a set of logic interfaces for the design specification to connect. The tools share a common database so that logical interactions do not require multiple entries. The designs are qualified, tested, and verified by other tools. The tools further optimize the placement and timing of the blocks on the chip with respect to each other and with respect to placement on a board. The suite may be run as batch processes or can be driven interactively through a common graphical user interface. The tools also have an iterative mode and a global mode. In the iterative mode, one or more of the selected tools can generate the blocks or modify a design incrementally and then look at the consequences of the addition, or change. In the global mode, the semiconductor product is designed all at once in a batch process as above and then optimized altogether. This suite of generation tools generates design views including a qualified netlist for a foundry to manufacture.

23 Claims, 10 Drawing Sheets
(1 of 10 Drawing Sheet(s) Filed in Color)

U.S. PATENT DOCUMENTS

2002/0073380 A1 6/2002 Cooke et al.
2002/0188910 A1* 12/2002 Zizzo .......................... 716/1
2004/0117744 A1* 6/2004 Nation et al. ................... 716/1
2004/0128626 A1* 7/2004 Wingren et al. ................ 716/1

* cited by examiner

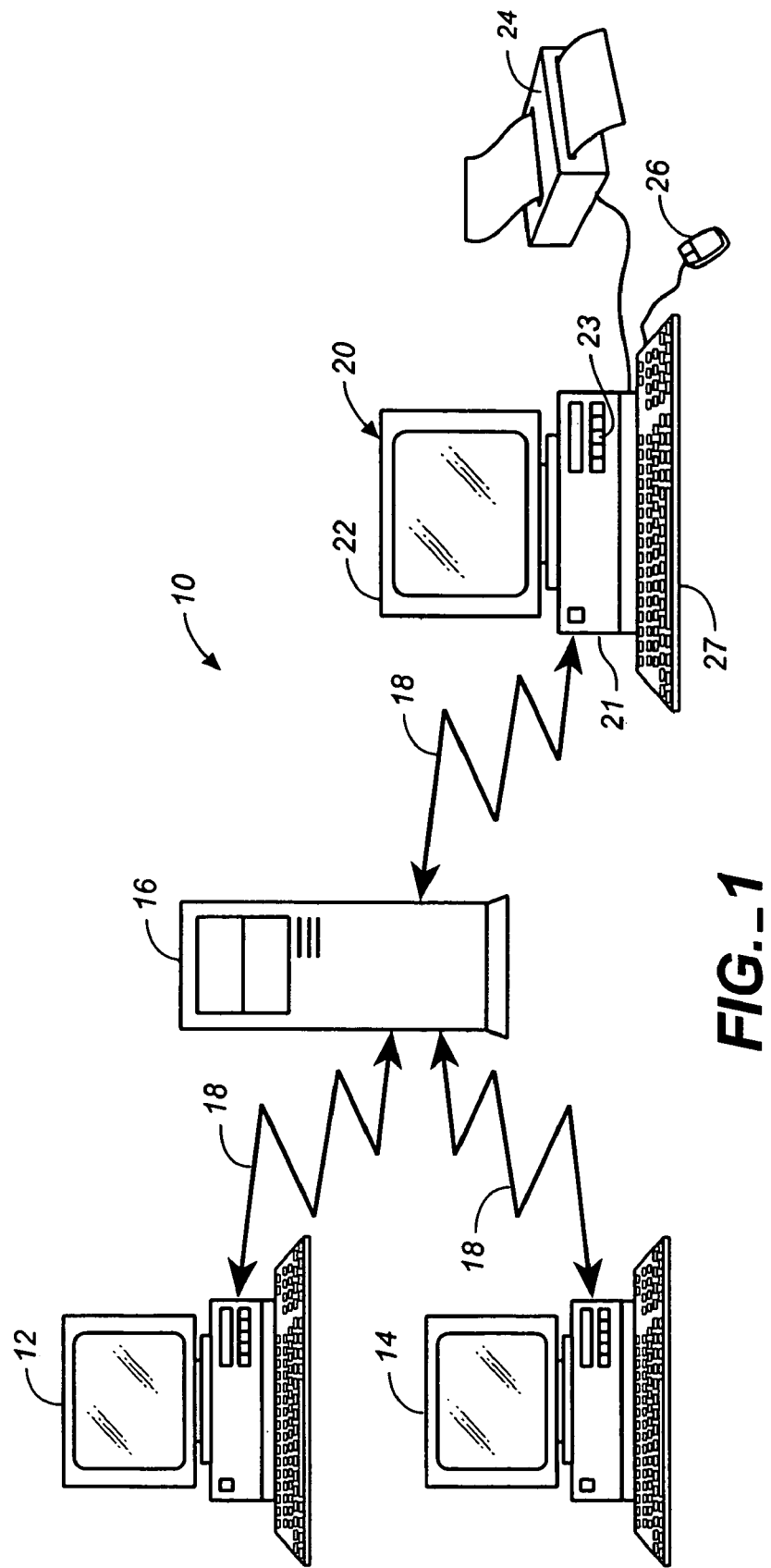
FIG._1

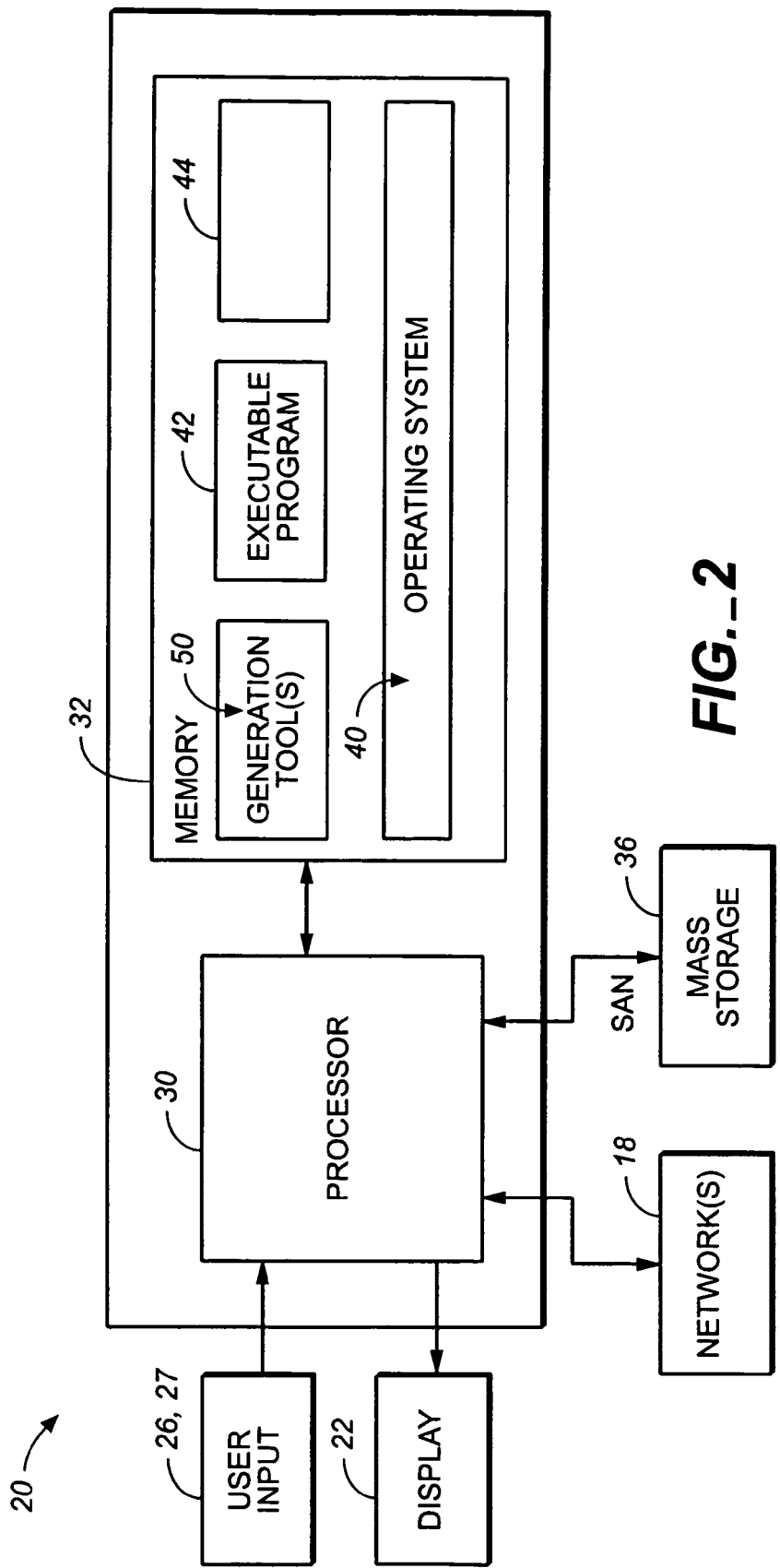
FIG._2

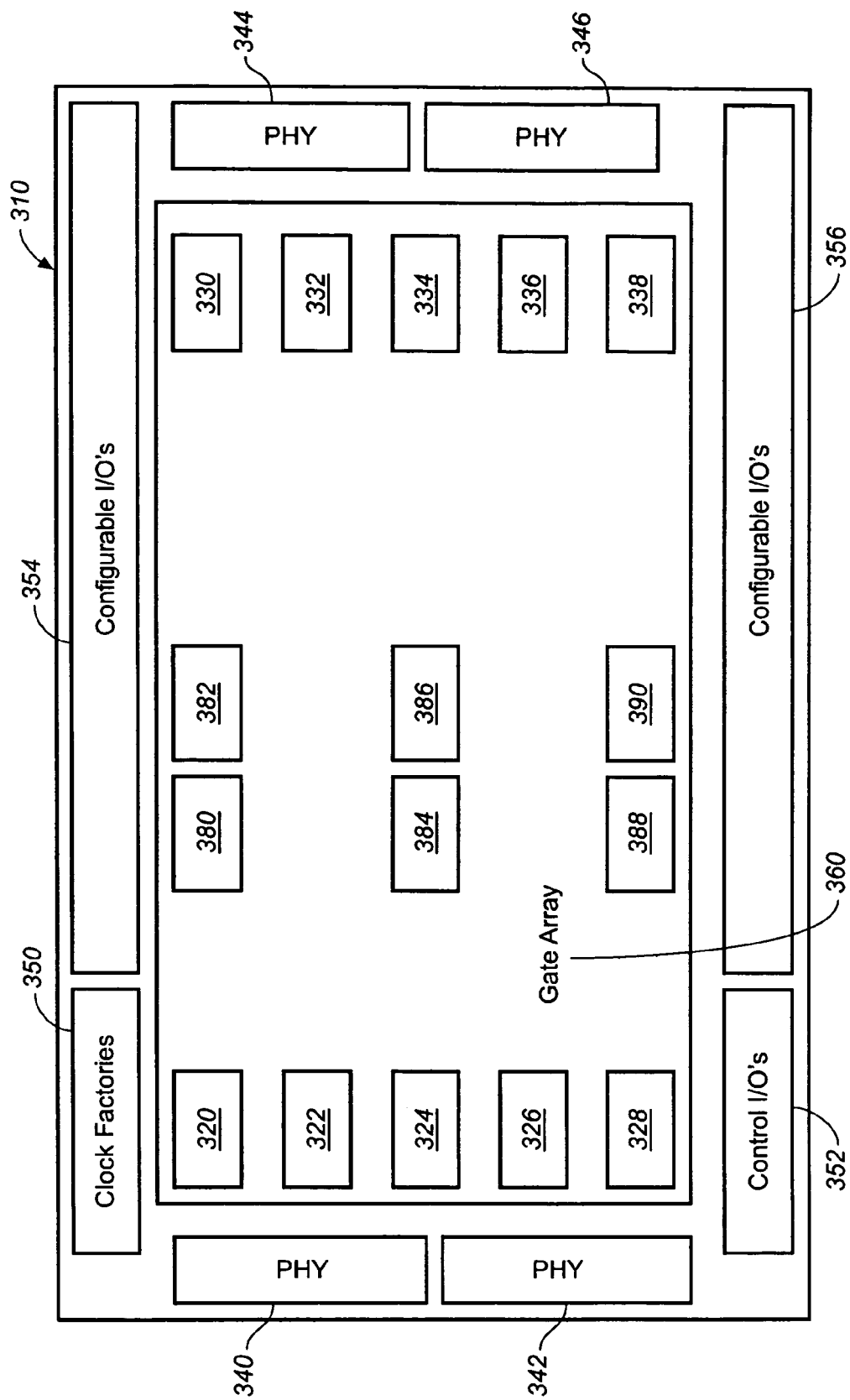
FIG._3

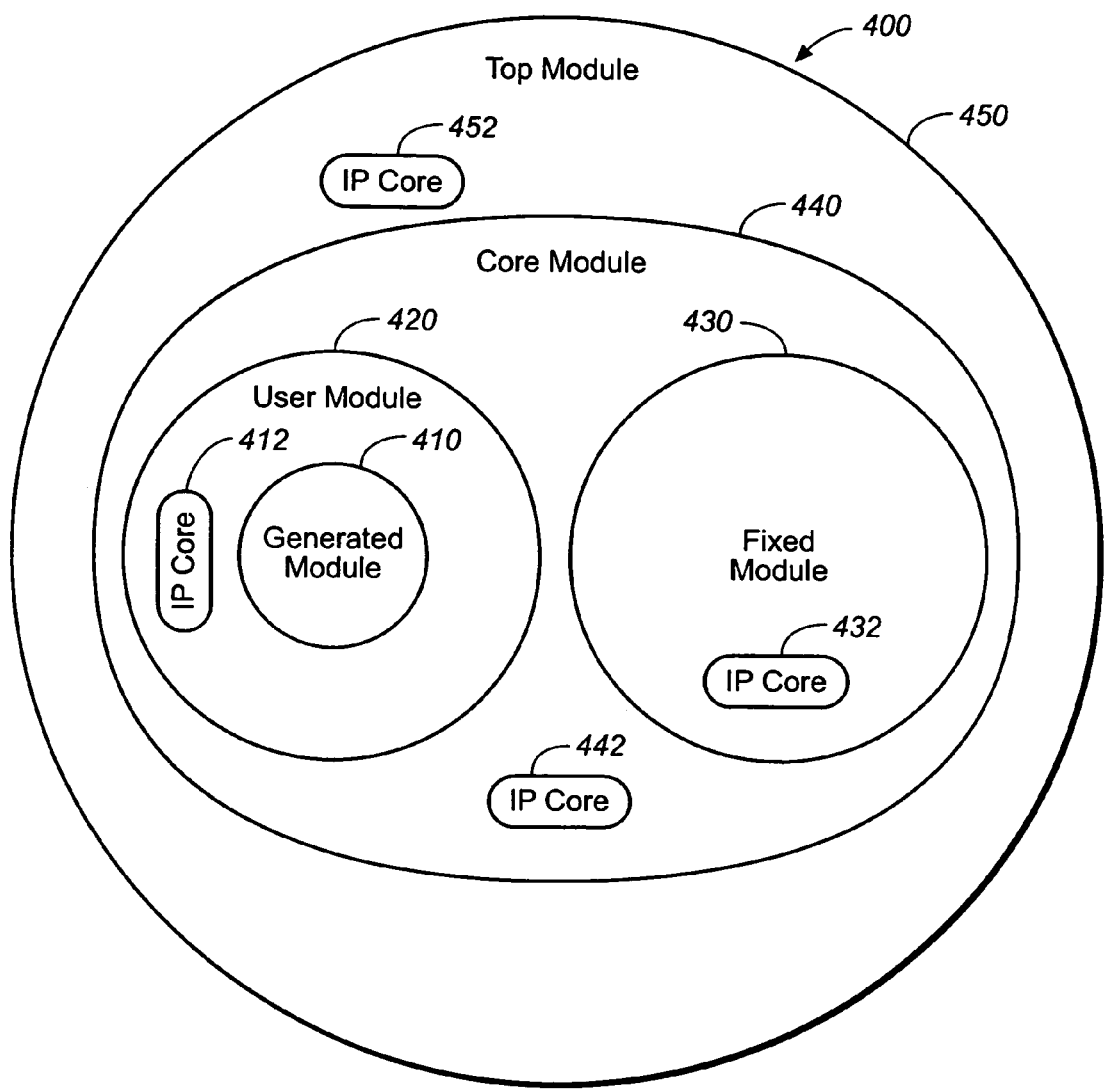
FIG._4

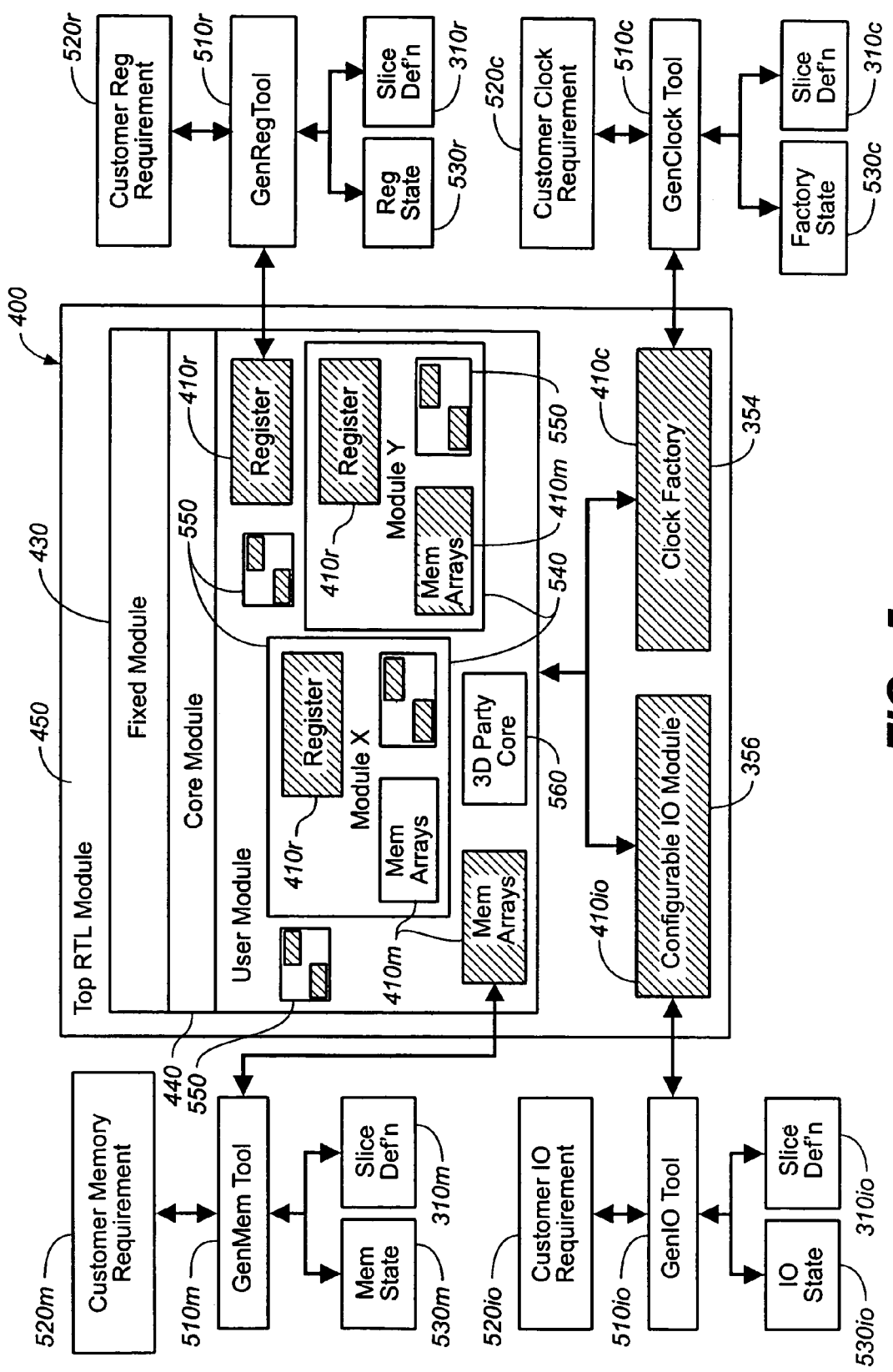
FIG._5

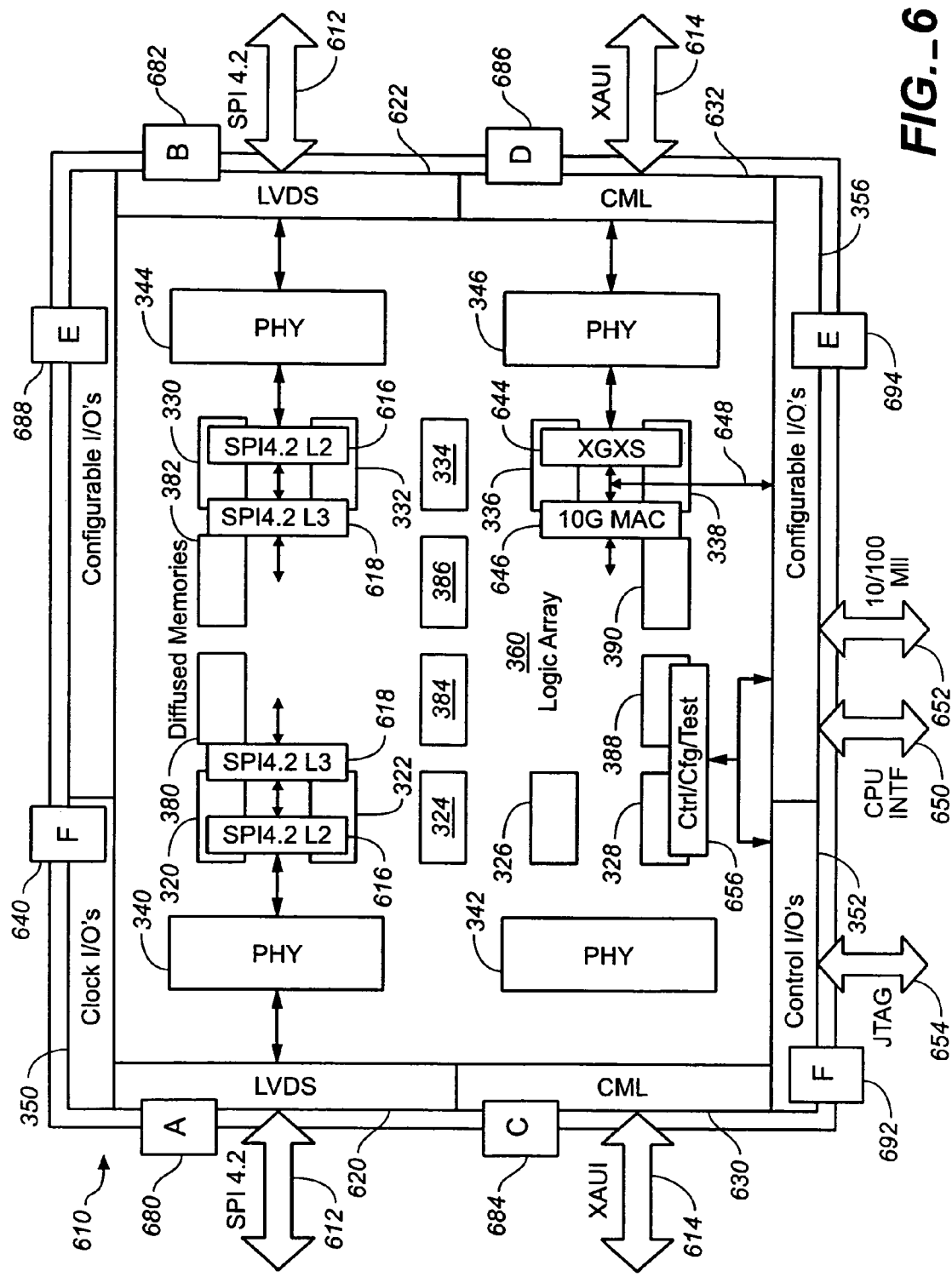

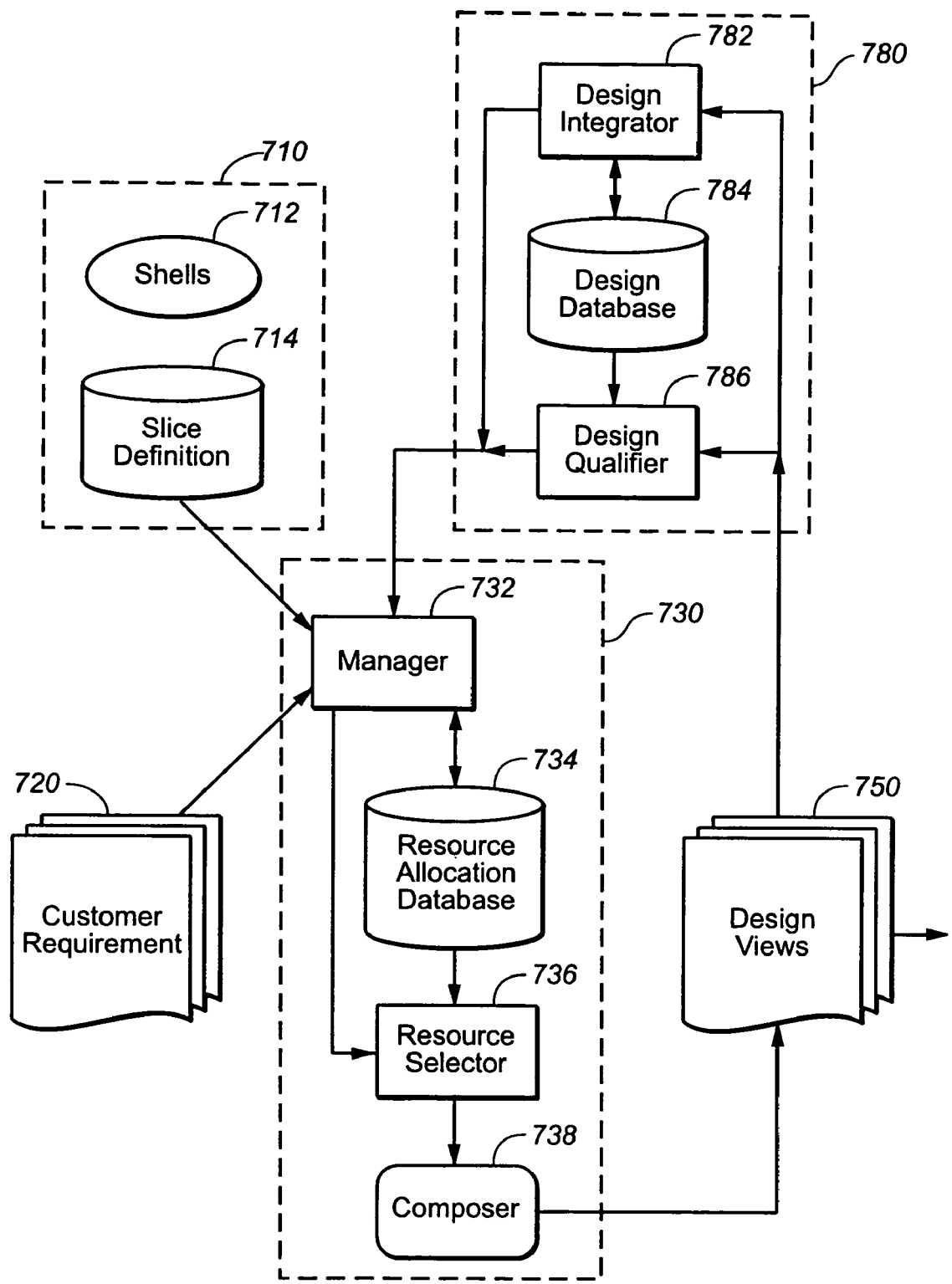
FIG._7

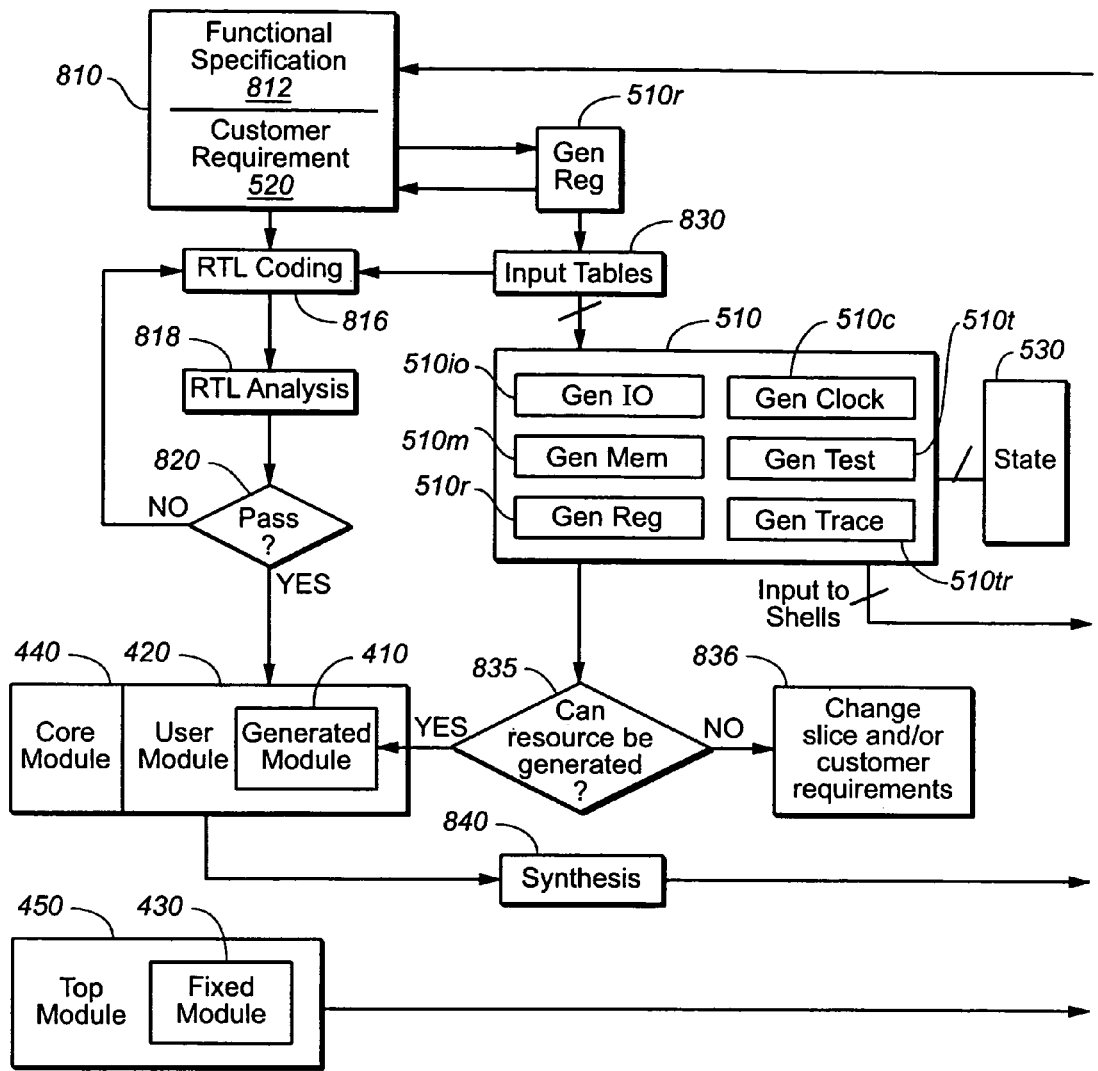
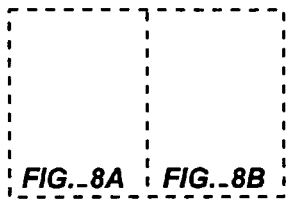
FIG._8A
FIG._8

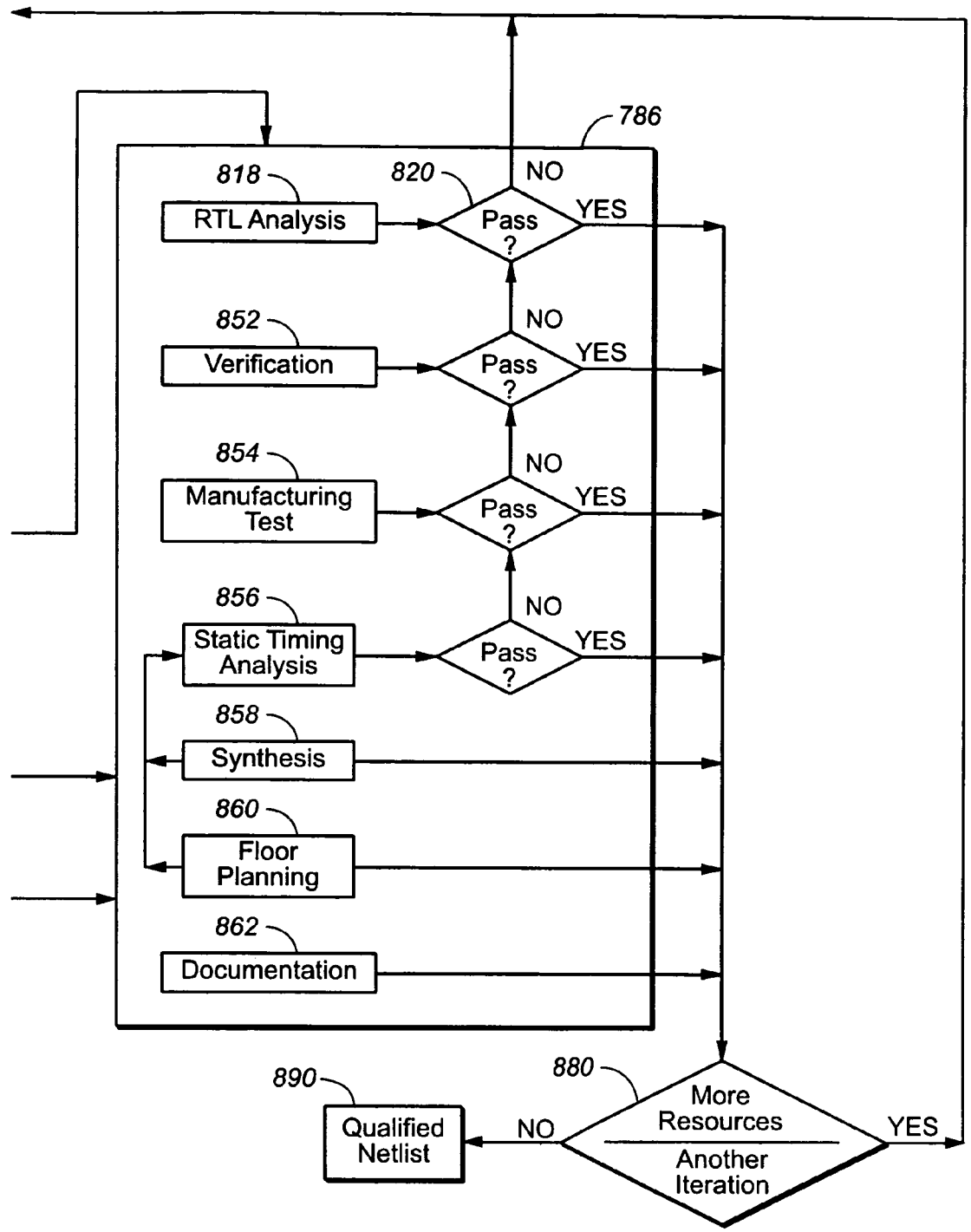
FIG._8B

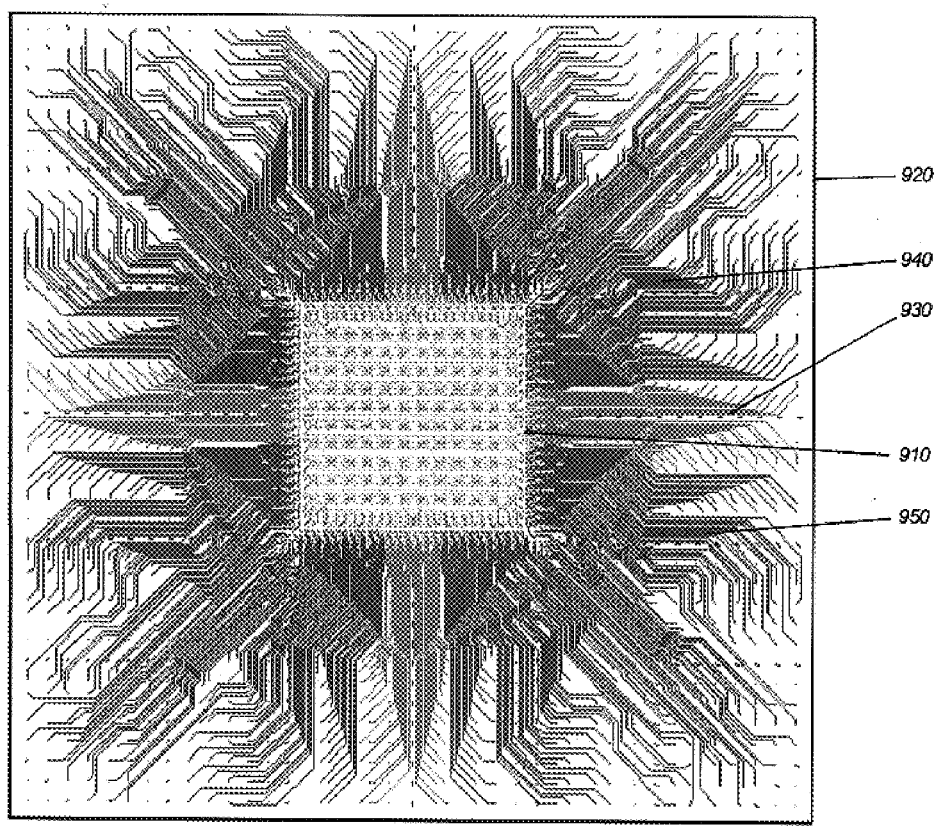
FIG._9

SUITE OF TOOLS TO DESIGN INTEGRATED CIRCUITS

CROSS REFERENCE TO RELATED APPLICATIONS

The present application is a divisional application under 35 U.S.C. §120 of U.S. application Ser. No. 10/335,360 filed 31 Dec. 2002, now U.S. Pat. No. 7,055,113 which is hereby incorporated by reference in its entirety. This application is also related to the following U.S. patents and applications, which are hereby incorporated by reference in their entireties: copending application Ser. No. 10/435,168 filed 08 May 2003 entitled AUTOMATION OF THE DEVELOPMENT, TESTING, AND RELEASE OF A FLOW FRAMEWORK AND METHODOLOGY TO DESIGN INTEGRATED CIRCUITS; copending application Ser. No. 10/318,792 filed 13 Dec. 2002 entitled entitled FLEXIBLE TEMPLATE HAVING EMBEDDED GATE ARRAY AND COMOSABLE MEMORY FOR INTEGRATED CIRCUITS; copending application Ser. No. 10/318,627 filed 13 Dec. 2002 entitled AUTOMATED SELECTION AND PLACEMENT OF MEMORY DURING DESIGN OF AN INTEGRTED CIRCUIT; U.S. Pat. No. 6,823,502 issued 23 Nov. 2004 entitled PLACEMENT OF CONFIGURABLE INPUT/OUTPUT BUFFER STRUCTURES DURING DESIGN OF INTEGRATED CIRCUITS; copending application Ser. No. 10/465,186 filed 19 Jun. 2003 entitled DESIGNING AND TESTING THE INTERCONNECTION OF ADDRESSABLE DEVICES OF INTEGRATED CIRCUITS.

FIELD OF THE INVENTION

This invention relates to the field of electronic integrated circuit design, and more particularly to the tools and methods for the design of integrated circuits.

BACKGROUND

Integrated circuits comprise many transistors and the electrical interconnections between them. Depending upon the interconnection topology, transistors perform Boolean logic functions like AND, OR, NOT, NOR and are referred to as gates. Some fundamental anatomy of an-integrated circuit will be helpful for a full understanding of the factors affecting the flexibility and difficulty to design an integrated circuit. An integrated circuit comprises layers of a semiconductor, usually silicon, with specific areas and specific layers having different concentrations of electron and hole carriers and/or insulators. The electrical conductivity of the layers and of the distinct areas within the layers is determined by the concentration of dopants within the area. In turn, these distinct areas interact with one another to form transistors, diodes, and other electronic devices. These specific transistors and other devices may interact with each other by field interactions or by direct electrical interconnections. Openings or windows are created for electrical connections between the layers by a combination of masking, layering, and etching additional materials on top of the wafers. These electrical interconnections may be within the semiconductor or may lie above the semiconductor areas and layers using a complex mesh of conductive layers, usually of metal such as aluminum, tungsten, or copper fabricated by deposition on the surface and selective removal, leaving the electrical interconnections. Insulative layers, e.g., silicon dioxide, may separate any of these semiconductor or connectivity layers.

Integrated circuits and chips have become increasingly complex, with the speed and capacity of chips doubling about every eighteen months. This increase has resulted from advances in design software, fabrication technology, semiconductor materials, and chip design. An increased density of transistors per square centimeter and faster clock speeds, however, make it increasingly difficult to specify and design a chip that performs as actually specified. Unanticipated and sometimes subtle interactions between the transistors and other electronic structures may adversely affect the performance of the circuit. These difficulties increase the expense and risk of designing and fabricating chips, especially those that are custom designed for a specific application. The demand for complex custom-designed chips increase with the increasing variety of microprocessor-driven applications and products, yet the time and money required to design chips have become a bottleneck in the time it takes to bring these products to market. Without an assured successful outcome within a specified time, the risks have risen along with costs and the result is that fewer organizations are willing to attempt the design and manufacture of custom chips.

The challenge of complexity has been met by introducing more powerful specialized software tools intended to design chips correctly and efficiently. As the software tools evolve, however, the tools themselves have become increasingly complex requiring more time to master and use them. Correspondingly, the cost of staffing, training, and coordinating the various aspects of chip design has also increased. One general response to this dilemma has been a call for what are termed "higher levels of abstraction," which simply means that the logical entities with which designers work are standardized, encapsulated, and bundled together so they can be treated like black box functions. This abstraction has characterized the semiconductor industry throughout its history. Today, however, the software tools used in chip design are so complex that it is difficult to adapt them to this higher level of abstraction. Coordinating these realms of complexity is a challenge in the design and fabrication of a custom chip. Customer needs and specifications must be aligned with tools and capabilities of both designers and fabrication facilities. Each fabrication facility, for example, operates with design rules, equipment, molds, recipes and standards that have myriad implications for the final work and must be considered early in the process.

Meanwhile, several types of chips have been developed that take advantage of this modular approach; they are partly fixed and partly programmable/customizable. The utility of these chips is limited by factors such as complexity, cost, time, and design constraints. The field programmable gate array (FPGA) refers to type of logic chip that can be reprogrammed. Because of the programmable features, FPGAs are flexible and modification is almost trivial. FPGAs, however, are very expensive and have the largest die size. The disadvantage of FPGAs, moreover, is their relatively high cost per function, relatively low speed, and high power consumption. FPGAs are used primarily for prototyping integrated circuit designs, and once the design is set, faster hard-wired chips are produced. Programmable gate arrays (PGAs) are also flexible in the numerous possible applications that can be achieved but not quite as flexible as the FPGAs, and are more time-consuming to modify and test. An application specific integrated circuit (ASIC) is another type of chip designed for a particular application. ASICs are efficient in use of power compared to FPGAs, and are quite inexpensive to manufacture at high volumes. ASICs, however, are very complex to design and prototype because of their speed and quality. Application Specific Standard Products (ASSPs) are hard-wired standard chips that meet a specific need, but this customization is both time-consuming and costly. An example of an ASSP might be a microprocessor in a heart pacemaker.

As an example, most ASICs today have an embedded or external central processing unit (CPU) connected internally to registers and memory, either on or off-chip. These registers and memories are read and written by the CPU through memory-mapped accesses and can be physically arranged and spread throughout the chip in many modules, some of which may be logically hierarchical. Documenting, implementing, connecting, and testing these registers and internal memories is extremely time consuming and prone to errors. Chip designers and testers define the specification and address map for registers and internal memory, the register transfer logic (RTL) implementation, the verification testcases, and the firmware header file all in separate and manual tasks. This approach is time consuming, tedious, and prone to errors created by manual editing.

There is thus a need in the industry to increase the flexibility of the design process of the integrated circuits yet at the same time reduce the cost of each individual design.

SUMMARY OF THE INVENTION

To address this need and others to leverage the advantage gained by using partially manufactured semiconductor chips with an automated and systematic method of generating and testing logic applied to the partially manufactured semiconductor, what is presented herein is a method for creating an application set, the application set comprising at least a description of a slice, which is the partially manufactured semiconductor chip. The slice has a transistor fabric that can be configured and instantiated with the automated method disclosed herein. The slice may further have at least one configurable I/O interface and perhaps, at least one or more diffused areas for memory arrays and/or third party IP cores, whose logic is either generated by or incorporated by the method herein. The method applies a variety of shells to the slice to create the application set: the variety of shells comprising a hierarchy of RTL modules, a verification shell, a static timing analysis shell, a manufacturing or testing shell, a synthesis shell, a documentation shell to generate the RTL and to apply any constraints onto the slice to create a semiconductor product specified by input customer requirements. Elements of the application set are input into a suite of generation tools, each of which has a manager, a resource database, and a composer/generator. Some of the tools also have a selector. Each tool allocates its respective resource of the slice to a function and generates the RTL necessary for correct and testable implementation of the resource. The tools include an I/O buffer structure generation tool, a memory generation tool, a clock generation tool, and a test generation tool. Optionally, the suite of tools may further include a register and/or a trace generation tool to further enhance the design cycle. The tools may be run incrementally or all the resources may be allocated at once to the customer's requirements. Consideration of the package specification allows the tools to not only place the memory and/or I/O buffer amplifiers and/or registers and the corresponding logic to optimize timing and testing within the semiconductor product, but also to optimize I/O to/from the product to the printed circuit board upon which it is mounted.

While presented here as a brief summary, full appreciation of the suite of tools, the application set, the use of the slice, and the shells will be realized upon viewing the following figures in conjunction with the detailed description that follows.

BRIEF DESCRIPTION OF THE DRAWINGS

The file of this patent contains at least one drawing executed in color. Copies of this patent with color drawings(s) will be provided by the Patent and Trademark Office upon request and payment of the necessary fee. The numerous advantages of the present invention may be better understood by reference to the accompanying figures in which:

FIG. 1 is a simplified block diagram of a networked computer system in which the method and the tools of the invention can be implemented.

FIG. 2 is a simplified block diagram of a computer workstation to which an integrated circuit developer may access and use the suite of tools to develop an integrated circuit in accordance with an embodiment of the invention.

FIG. 3 is a simplified block diagram of a semiconductor slice from which the suite of generation tools could generate and from which the suite of generation tools will generate an integrated circuit in accordance with an embodiment of the invention.

FIG. 4 is a simplified diagram illustrating the hierarchy of logic generated by the suite of generation tools to be implemented on the slice in accordance with features of the invention.

FIG. 5 is a simplified block diagram illustrating the RTL logic shell placed onto the slice and the relationship to features of the suite of generation tools. It is suggested that FIG. 5 be printed on the face of the patent.

FIG. 6 is a simplified block diagram of an example of an application set generated from the slice and shells by the suite of generation tools in accordance with features of the invention.

FIG. 7 is a simplified block diagram of the components comprising at least one of the suite of generation tools.

FIG. 8 is a flow chart of the process by which the suite of generation tools can be used to design and qualify an integrated circuit.

FIG. 9 is a color illustration of a top routing layer of a semiconductor chip designed, qualified, and optimized for layout and placement on a board by the suite of generation tools.

DESCRIPTION OF THE INVENTION

Referring to the drawings, FIG. 1 illustrates an exemplary computer system 10 upon which the suite of generation tools could be installed and/or used. Computer system 10 is illustrated as a networked computer system that includes one or more client computers 12, 14 and 20 such as workstations coupled through a network 18 to a server 16. Server 16 could also be a personal computer-based server, a minicomputer, a midrange computer, or a mainframe computer. While shown here as a point-to-point connection, computers 12 and 14 need not be coupled to server 16 directly, but may be coupled to yet another network which in turn is connected to server 16. Network 18 may represent practically any type of networked interconnection including but not limited to local-area, wide-area, wireless, and public networks such as the Internet, and any number of routers and hubs connected in between, e.g., a local-area network to a wide-area network to the Internet through a series of routers and/or other servers. Any number of computers and other devices may be networked through network 18, e.g, multiple servers, hand-held devices, etc.

For the purposes of the invention, computer 20 may represent practically any type of computer, computer system, or other programmable electronic device, including a client computer similar to computers 12, 14 and 20 of FIG. 1, a server computer, e.g, similar to server 16 of FIG. 1, a portable computer, an embedded controller, a hand-held device, etc. Computer 20 may be coupled in a network as shown in FIG. 1 or may be a stand-alone device. Computer 20 will hereinafter also be referred to as a computer although it should be appreciated that the term "computer" may also include other suitable programmable electronic devices capable of allowing a chip designer to use the suite of generation tools.

With reference to FIG. 2 wherein at least one of the suite of generation tools is installed as an application, computer 20 typically includes at least one processor 30 coupled to a memory 32. Processor 30 may represent one or more processors or microprocessors and memory 32 may represent the random access memory (RAM) devices comprising the main storage of computer 30, as well as any supplemental levels of memory such as cache memories, nonvolatile or backup memories, programmable or flash memories, read-only memories, etc. In addition, memory 32 may be considered to include memory storage physically located elsewhere in computer 30, e.g., any cache memory in a processor 30, as well as any storage capacity used as a virtual memory, e.g., as stored on a mass storage device 36 coupled to computer 20 with a storage area network (SAN) or on another computer coupled to computer 20 via network 18.

Computer 20 typically receives a number of inputs and outputs for communicating information externally. For interface with a user or operator, computer 20 typically includes one or more user input devices 26, 27, e.g., a keyboard, a mouse, a trackball, a joystick, a touchpad, and/or a microphone, among others, and a display 22 such as a CRT monitor, an LCD display panel, and/or a speaker, among others. It should be appreciated, however, that some server implementations may not support direct user input and output.

For additional storage, computer 20 may also include one or more mass storage devices 36, e.g., a floppy or other removable disk drive, a hard disk drive, a direct access storage device, an optical drive, e.g., a CD drive, a DVD drive, etc., and/or a tape drive, among others, that may be connected directly or may be connected through a SAN or other network. Furthermore, computer 20 may include an interface connected to one or more networks 18, e.g., a local-area network, a wide-area network, a wireless network, and/or the Internet, among others, to permit communication of information with other computers coupled to the network. It should be appreciated that computer 20 typically includes suitable analog or digital interfaces between processor 30 and each of the components 18, 22, 26, 27, and 36 as is known in the art.

Computer 20 operates under the control of an operating system 40 such as a UNIX-based or WINDOWS-based operating system, as is known in the art, but is not so limited by the particular operating system. Operating system 40 executes various computer software applications, components, programs, objects, modules, etc., such as an executable program 42, etc. Although one or more of the suite of generation tools 50 may be in memory 32 for the purpose of developing an integrated circuit, it need not be. The processor 30 may access one or more of the generation tools, the required data, other various applications components, programs, objects, modules, etc., resident on one or more processors in another computer coupled to computer 20 via a network 18, e.g., in a distributed or client-server computing environment whereby the processing to implement the functions of the suite or one of the tools may be allocated to multiple computers over a network.

In general, the suite of generation tools executed to implement the embodiments of the invention whether implemented as part of an operating system or a specific application, component, program, object, module, or sequence of instructions will be referred to herein as the suite of generation tools, the suite, or just simply, the tools. The tools typically comprise one or more instructions that are resident at various times in various memory and storage devices in a computer, and that, when read and executed by one or more processors in a computer network, cause that computer to perform the steps necessary to execute steps or elements embodying the various aspects of the invention. While the invention has and hereinafter will be described in the context of fully functioning computers and computer systems, those skilled in the art will appreciate that the various embodiments of the invention are capable of being distributed as a program product in a variety of forms and that the invention applies equally regardless of the particular type of signal bearing media used to actually carry out the distribution. Examples of signal bearing media include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links. In addition, various tools described hereinafter may be based upon the application for which they are implemented in a specific embodiment of the invention. It should be appreciated that any particular nomenclature that follows is used merely for convenience, and thus the invention should not be limited in its use solely to any specific application identified and/or implied by such nomenclature. The exemplary environments illustrated in FIGS. 1 and 2 are not intended to limit the present invention. Indeed, those skilled in the art will recognize that other alternative hardware and/or software environments may be used without departing from the scope of the invention.

The suite of generation tools described herein interprets an application set, also described herein, and a customer's requirements for an integrated circuit. Preferably, the application set and the customer's requirements are programmed according to guidelines for easy interpretation of the suite, but need not be so. In turn, the suite of generation tools generates logic and design views to satisfy the customer's requirements within the purview of an application set. The tools are self-documenting and self-qualifying; preferably they may share the same user interface and database. A particularly useful feature of the suite is that they may be updated in real time to store the state of what is generated so the suite can execute in an iterative fashion to include incremental design changes and then to consider the effect of the changes. Alternatively, each tool or the entire suite may be run in a batch process for global optimization. Each tool, the customer's requirements, and the application set may be on the same or different computers connected by a network as described above.

Broadly, the suite of generation tools comprises two categories: tools that manage the resources of the slice as presented in the application set; and tools that enhance productivity. Typical of the resource management tools are those that specifically create usable memories, I/Os, clocks, and tests.

One such resource management tool is a memory generator, such as disclosed in copending U.S. application Ser. No. 10/318,627 enitled Automatic Selection and Placement of Memory During Design of an Integrated Circuit filed 31 Dec. 2002. This tool, GenMem, inter alia, manages existing memory resources on the slice and creates synthetic logical memory elements from a varied collection of available diffused and/or R-cell memory arrays and/or transistor fabric on the slice definition. GenMem further generates memory wrappers with memory test structures, pipeline first in first out (FIFO) logic, and logic required to interface with any logic within the fixed or user modules.

The suite may further include a tool, GenI/O, that generates the I/O netlist of the configuration and allocation of external I/Os according to the design customer requirement, JTAG, boundary scan, and simultaneous switching output (SSO), and may also generate and manage the RTL module that ties or closes unused I/O cells to an appropriate inactive state, such as described U.S. Pat. No. 6,823,502 entitled Placement of Configurable Input/Output Buffer Structures During Design of Integrated Circuits issued 23 Nov. 2004.

A clock generation tool, GenClock, as part of the generation tool suite creates a collection of clocks and resets that form up a clock tree as specified by the customer requirements. GenClock further ensures that the correct test controls for clocking are created and connected at the same time within the context of the slice definition. Thus, GenClock produces testable clock generation, phase lock loop (PLL) wrappers, coordinated reset mechanisms, and distribution, such as in described in U.S. Pat. No. 6,910,201 issued 21 Jun. 2005 entitled CUSTOM CLOCK INTERCONNECTS ON A STANDARDIZED SILICON PLATFORM.

A test generation tool, GenTest, generates test structures and connects logic elements to the generated test structures. GenTest further manages the test resources, determines what resources are being used on the chip and will produce appropriate testbench files, such as disclosed in U.S. Pat. No. 6,871,154 issued 22 Mar. 2005 entitled METHOD AND APPARATUS FOR AUTOMATICALLY CONFIGURING AND/OR INSERTING CHIP RESOURCES FOR MANUFACTURING TESTS, hereby incorporated by reference in its entirety.

One of skill in the art will understand that other resource management tools are possible given knowledge of the structure and function of the requisite logic; that these tools have been defined to facilitate their ease of use. Some implementations may combine features of, for example, a memory generation tool with a test generation tool, and exclude other features, to yield yet a whole new tool. Such tools incorporating pieces of tools and intended to transform transistor fabric into functional semiconductor modules are within the scope of the invention.

Typical of the enhancement tools is a register and trace generation tool that automates the process of documenting, implementing, and testing registers and internal memories. It may further configure registers that are not part of the data flow, such as disclosed in copending U.S. application Ser. No. 10/465,186 filed 19 Jun. 2003 entitled DESIGNING AND TESTING THE INTERCONNECTION OF ADDRESSABLE DEVICES OF INTEGRATED CIRCUITS. Yet another generator tool that may be a part of the suite described herein is one which configures spare or unused resources such as unused diffused memories for trace arrays where state and debug signals can be input for logic analysis and trace storage, such as described in copending U.S. application Ser. No. 10/245,148 filed 16 Sep. 2003 entitled AUTOMATED USE OF UNALLOCATED MEMORY RESOURCES FOR TRACE BUFFER APPLICATION. These and all of the other referenced copending LSIL dockets are hereby incorporated by reference in their entireties.

As mentioned, one of the inputs to one or more of the generation tools is an application set. An application set is, inter alia, a description of the slice and several shells that make the slice useful to a chip designer. Viewing FIG. 3, a slice 310 is a partially manufactured semiconductor device in which the wafer layers up to the connectivity layers have been fabricated. The slice 310 comprises a base semiconductor wafer from, e.g., silicon, silicon-on-insulator, silicon germanium, gallium arsenide, other Type II, IIII, IV, and V semiconductors, etc. and is a piece of semiconductor material into which blocks or hardmacs have been diffused into the semiconductor layers. Diffusing a semiconductor wafer to create a hardmac simply means that during fabrication of the wafer layers, transistors or other electronic devices have been particularly arranged in the wafer layers to achieve specific functions, such as diffused memory 320-338, 380-390, data transceiver hardware such as I/O PHYs 340-346, clock factories including PLLs 350, control I/Os 352, configurable input/output (I/O) hardmacs 354, 356; each of the hardmacs have an optimum arrangement and density of transistors to realize its particular function. The slice further comprises an area of transistor fabric 360 for further development of the slice 310 using the suite of generation tools described herein. Transistor fabric 360 is an array of prediffused transistors in a regular pattern that can be logically configured by the suite of generation tools herein to achieve different functions. A cell refers to the personalization of the interconnect layers that instantiate the logic gates of the transistor fabric. Some of the blocks of diffused memory 380-390 may have been compiled by a memory compiler for specific sizes, timing requirements, connections, etc. A further feature of the suite herein is that given a slice such as that shown in 310, not only is the placement of the hardmacs relative to other diffused objects identified, and areas for known logic reserved, but the placement of these hardmacs, compiled memories, and the reserved areas of the transistor fabric 360 have been situated to achieve the desired timing and performance both within the slice and for the slice to connect to the larger board, as will be discussed.

One of skill in the art will appreciate that the slice 310 shown in FIG. 1 is only one example of a slice and its components. Different slices may contain different amounts and arrangements of transistor fabric, different amounts of diffused and/or compiled memories, both fixed and configurable I/O blocks, clocks, etc. depending upon the purpose of the final integrated chip. For instance, if the final chip is intended to be a communication and/or network integrated circuit, the periphery of the slice may contain many I/O cells that have been fixed as PHYs and/or that can be configured differently from one another. Likewise, if the final integrated chip is intended to be a specialized microprocessor then it may not have as many I/O hardmacs-or configurable I/O, and more or less diffused registers and memories. The point is that there are different levels of customization of the slices for different semiconductor products. The slice 310, moreover, optionally may include the contact mask and some of the fixed higher layers of connectivity for distribution of power, ground, and external signal I/O.

The slice definition is a detailed listing of the features available on the slice, such as the area and availability of transistor fabric, the I/O and memory available, the requirements of the hardmacs, the cost of the slice, the ideal performance that can be expected of the slice, the expected power consumption, and other functional requirements. For memory elements, the slice definition may include, inter alia, details of: (a) area and physical placement of the memory array and its interface/connection pins; (b) bit width and depth; (c) organization, e.g., numbers of read/write ports, bit masking; (d) cycle time; and (e) power estimates. For I/O elements, the slice definition may provide, inter alia, the types of I/O, the I/O drive strength, etc. For clock elements, the slice definition provides the frequencies at which the slice may operate, the duty cycle, etc. Other details of the slice definition may include the configuration of the transistor fabric and the diffused and compiled elements, the status of the logic, the required control signals and the features enabled by the control signals, whether any element undergoes testing, the location and the number of the elements on the slice, etc.

The slice itself is of little use to a designer needing to develop register transfer logic (RTL), so some representation of the diffused resources of the slice is needed; shells are aspects of this representation. Shells are the logic infrastructure that makes the slice useful as a design entity, and the suite of generation tools generates some shells and uses other shells to facilitate this development. Using the suite of generation tools and the accompanying RTL shells, a chip designer can integrate her/his customer's requirements with the resources of the slice, verify and synthesize designs generated by each tool, insert clocks, test interconnects, integrate the designs together to create a complete design. The resultant design, moreover, is a qualified netlist with appropriate placement and routing amongst the existing resources and for external connections to a board. To create a customized chip, all that is needed is a small set of remaining masks to create the interconnections between the preplaced elements.

There are a number of shells used as a basis for a designer to integrate her/his customer's requirements using a particular slice, and depending upon the designer's particular task; one or more of these shells can be used. These shells comprise: the RTL shells, the documentation shell, the verification shell, the synthesis shell, the static timing analysis shell, the manufacturing test shell, the floorplan shell, and the RTL qualification shell. The RTL shell provides a logical description of an aspect of the slice or of the generated or user resources. The documentation shell may be considered the functional description of the resources. The verification shell is the functional verification description, whereas the synthesis shell may be thought of as the generation description. The static timing analysis shell is the timing description, the manufacturing test shell is the test description, and the floorplan shell is a location description of the slice resources.

The RTL shells may be viewed as a hierarchy of logic, such as shown in FIG. 4. The inner module is called the generated module 410 and typically includes a significant amount of preplaced, timed, and proven components, such as dock generators, system controllers, reset logic, analog serializers/deserializers (SERDES) hardmac components, I/O stubs, memory stubs, memory built-in self test (MBIST) controller arrays. Each of the suite of generation tools herein creates or generates the RTL in the generated module to personalize the transistor fabric to satisfy a customer requirement not supplied by the application set, by any IP cores, or by the customer. In some instances, a diffused hardmac may not be used so it is stubbed. "Stubbing" refers to tying the inputs of these hardmacs, such as I/Os and memories, to inactive levels so the hardmacs are not functionally active. Stubbing may take place in the generated module 410.

Surrounding the RTL logic of the generated module 410 is the user module 420. Any customer logic provided will be inserted in the user module 420 and will be conditioned by an RTL analysis tool to implement the customer's logic quickly. An example of such an RTL analysis tool is TERAFORM, a commercially available tool that identifies potential timing and design closure issues of the customer's specification early in the design cycle. Also included in the user module 420 are instantiated diffused and R-cell memory and their corresponding wrappers, and registers, and a list of ports having tie-offs, i.e., the list of I/O ports that will not be used. These memory, registers, and list of ports can be generated by one of the suite of generation tools or may be provided as part of the customer's requirements. The user module 420 may also include IP cores 412, an example of which is an AMBA module. An AMBA module, in accordance with the industry standard AMBA specification, facilitates the implementation of an on-chip bus connecting hardmacs with the corresponding logic so chip developers can implement and test blocks without prior knowledge of the system into which the component will be finally integrated. A typical AMBA-bus consists of a high-speed, high-bandwidth system bus that connects any embedded processors in the slice to high-speed, high-bandwidth I/O peripherals, direct memory access (DMA) controllers, high-bandwidth data-intensive applications using the slice memory and interfaces. The AMBA standard also specifies a peripheral bus connected to the system bus but with a simpler bus protocol designed for ancillary or general-purpose peripherals such as timers, interrupt controllers, UARTs, I/O ports, etc. The incorporation of the AMBA module 412 particularly facilitates the use of the suite of generation tools in a distributed system.

The fixed module 430 is created as part of the application set creation process. The fixed module 430 encompasses the fixed resources of the application set such as fixed instantiated hardmacs like the protocol layers on the interior of the slice and/or the IP cores 432 necessary for the hardmac PHYs, such as an XGXS to support data transfer at Gigabit Ethernet speeds, or a MW SPI4 core. The fixed module 430 may be as simple as logic signals directly connected to external chip I/Os, or it may be more complex set of proven modules upon which the user module 420 can build. For example, the fixed module 430 of the RTL shell could include a complete PCI bus controller including all the connections to external I/Os and/or a DDR/SRAM memory controller, a processor subsystem, etc. With the use of these and other industry standards, the customer does not have to spend design resources and time reinventing a standard connection or bus or other function.

The core module 440 encompasses the fixed module 430 and the user module 420 and provides a set of logic interfaces to which the user module 420 and the fixed module connect therebetween and to the top module 450. Although the core module 440 typically will not have any IP cores 442, there may be an instance in which an IP core 442 may be used to connect the fixed module 430 to the user module 420.

The top module 450 of the RTL shell includes the core module 440 and all of its constituents. The top module 450 further contains the I/O blocks and the I/O diffused areas and comprises appropriate logic for the hardmacs and configured logic towards the periphery of the slice. This includes the clock factories, the PLLs, the I/O netlists, the JTAG tap controller, test logic, etc. Some of these blocks may be IP cores 452 having proven and fixed logic.

FIG. 5 is another perspective of how the RTL shells actually are incorporated onto a shell, and the relationships to the suite of generation tools. Shown in FIG. 5 is the RTL hierarchy 400. Surrounding the RTL hierarchy 400 as inputs are the customer requirements 520*, some or all of the suite of generation tools 510*, the state 530* of each iteration of a particular tool, and the slice definition 310*, where * represents a code to indicate a particular tool or subsystem, for example, m for memory, r for register, io for I/O, c for clock, etc. Thus, the GenMem tool 510m takes as input the customer memory requirement 520m, the memory state 530m of any memory generated from a previous iteration of the tool or from a customer, and the slice definition for memory 310m. Similarly, the GenI/O tool 510io, the GenClock tool 510c, and the GenReg tool 510r have their respective inputs and feedback mechanisms to the customer requirements 520io, 520c, 520r, and any previously stored state 530io, 530c, 530r, and the slice definitions 310io, 310c, and 310r. The memory generation tool 510m generates the memory RTL logic 410m for the memory arrays from the transistor fabric; an I/O generation tool 510io generates RTL 410io for the configurable I/O module 356 from the transistor fabric; the clock generation tool 510c generates the clock RTL logic 410c for the clock factory 354; and the register generation tool 510r creates the RTL for the register arrays 410r, and so on. In this particular illustration, a customer further specified three arrays 550 to be generated from the transistor fabric. The customer specified Modules X and Y 540 which were generated using the tools as described above. The IP core 560 may be, for instance, a processor core, a bus interface, etc.

The verification shell is also part of an application set and provides a total environment to functionally test not only the RTL shells as above but also verifies that the customer's requirements have been correctly incorporated into slice and the RTL shells. The basic strategy of the verification shell is to perform both block-level and fill-chip verification using random testcases because a random environment, vis a vis directed testcases, provide more comprehensive verification coverage. A block consists of a single module or group of modules that make up a given subsystem. The verification shell exhaustively verifies all functionality within each module or subsystem and then verifies the full-chip environment of the intermodule and I/O connections, including the connections from the I/O to the board. The module interoperability and top-level functions are also verified. The verification shell may include components such as transactors, monitors or interface checkers, scoreboards, reference models, and test suites between the internal logic interfaces and the chip I/Os. As part of the test suites, the verification shell further incorporates commercially available tools that simulate the hardware on a chip, such as MTI MODELSIM. Other parts of the verification shell may automatically generate functional tests, data and temporal checking, functional coverage analysis, and HDL simulation control, such as VERISITY SPECMAN ELITE. The verification shell may also analyze any finite state machines, the expression and code coverage, load sharing facilities, and controls generation of executables/nonsource files from the source files. Thus, the verification shell may catch such early detectable and resolvable problems may include central versus local multiplexing of the data path and test structures, whether to implement a complex finite state machine or use fewer smaller state machines at several locations in the slice, mapping memory of the status and configuration registers across the slice.

The application preferably includes several other shells. A synthesis shell has scripts to synthesize not only the elements in the shell but also any generated logic, the user module including any customer constraints, instruction files, and constraints for synthesis flows and tools, such as SYNOPSIS DESIGN COMPILER. These synthesis scripts are preferably optimized for the slice's transistor fabric using libraries that describe the available customized cells. A static timing analysis shell is provided to drive timing from the external of the chip that includes the timing constraints for all interfaces presented to the designer in the RTL shell. The static timing analysis shell preferably includes timing models of the RTL shell components connected to the chip I/Os. A manufacturing test shell might include the stub interface that brings scan chains to the customer logic plus any preexisting test engines and mechanisms in the shell and slice, such as fault coverage, parametric and skew information.

A documentation shell provides templates to interface with the suite of generation tools and may provide an interface by which the user module can be compatibly input to the suite. Typically, the documentation shell may include the resources of slice including the total I/Os and memories available, the I/Os and memories available after assignment and generation, the interface timing diagrams, and the block functional specifications.

The floorplan shell describes the location of the physical slice resources on the slice, particularly physical placement requirements on the transistor fabric and power grid to enable R-cell hardmac creation. The floorplan shell further has the physical placement requirements on the memories, configurable I/Os, PLL, etc. used in allocating the resources of the slice by the suite of generation tools. Thus, the shells provide proven interfaces and controllers that may be in compliance with industry standards, so the chip developer and/or the customer need only concentrate on developing their differentiating logic.

In a simple embodiment, the slice and its shells comprise an application set. Elements of the application set are input to the suite of generation tools and, together with the suite of tools, may be delivered to a chip developer who might then incorporate a customer's requirements to achieve a fully functional integrated circuit at less cost and less time than to custom design an ASIC for the same purpose. Thus, in another embodiment, the collection of shells, the slice definition, one or more of the suite of generation tools, and the methodology for developing an integrated circuit according to the customer's requirements using the generation tools herein comprise an application set.

FIG. 6 is an example of application set 610 configured as a communication and networking chip to receive and transfer data according to the SPI4.2 industry standard protocol 612 and/or a 10 Gigabit Ethernet standard 614, and to interface that data with various other protocols as will be discussed. Application set 610 has a number of ports 680-694 labeled A-F through which to receive and transmit data, clock signals, control signals, test signals, etc. Portions of the diffused memory 320-338, 380-390 and logic array 360 have been fabricated as a level 2 protocol layer 616 and level 3 protocol layer 618 to receive and transmit data which may be, e.g., high speed gigabit serial data through I/O interfaces 620, 622 to/from PHY 340 and PHY 344, respectively, that may comprise, e.g., extremely high bandwidth CMOS circuits. One such PHY is HYPERPHY, a trademarked PHY available from LSI Logic, Inc. Also shown in FIG. 6, are two I/O blocks or interfaces 630, 632 for optional XAUI high speed data 614 into and out of a compatible PHYs 342, 346 for high speed data. XAUI supports up to 10 gigabit per second (Gbps) for differential serial transmission and operates at 3.125 Gbps. XAUI requires an appropriate extender sublayer, XGXS, 644 to extend the XGMII (ten gigabit media independent interface) and a 10G media access controller (MAC) 646, both of which may be generated from memory 336, 338, 390 and logic array 360 with at least one of the suite of generation tools herein. A PHY for XAUI is GIGABLAZE, also a trademarked PHY available from LSI Logic, Inc. Alternatively, data may be routed from the 10 G MAC 646 on a different path 648 to additional protocol layers (not shown) to configurable I/O block 356 having ports 694 to the processor unit interface 650 and the 10/100 MII 652 to transmit and receive control and configuration signals to/from the control/configuration/test block 656. I/O block 356 could be configured for a reduced ten bit interface (RTBI) with the accompanying protocol layers being generated from the transistor fabric using the suite here. Meaningful RTL shells used in the application set of FIG. 2 may include a MW SPI4 core, the XGXS 644 and its test stub, a clock factory 350, a JTAG interface 654, appropriate memory wrappers, and memory and I/O stubs. A directory of the application set of FIG. 6 is given below.

Directory of Application Set for FIG. 6

```
bin
hdl
    ahb_components
    clk_clock_factory_components
    ior_io_ring
    jtag
    mw_spi4
    pll
    cm_core_module
    reg_register_components
    tm_top_module
    xgxs-10G_Ethernet_xs
mem
rac
    ahb_components
    clk_clock_factory_components
    ior_io_ring
    jtag
    mw_spi4
    pll
    cm_core_module
    reg_register_components
    tm_top_module
    xgxs_10G_ethernet_xs
sim
    block lib
        jtag
        mw_spi4
        xgxs_10G_Ethernet_xs
    evc_lib
        ahb
        jtag
        spi4
        xaui
    base lib
        base
    tb
        mw_spi4
        um_ref
        um_stub
        um_subsys
        um_test
        xgxs_10G_ethernet_xs
sta
    ahb_components
    clk_clock_factory_components
    ior_io_ring
    jtag
    mw_spi4
    pll
    cm_core_module
    reg_register_components
    tm_top_module
    xgxs_10G_ethernet_xs
syn
    ahb_components
    clk_clock_factory_components
    ior_io_ring
    jtag
    mw_spi4
    pll
    cm_core_module
    reg_register_components
    tm_top_module
    xgxs_10G_Ethernet_xs
```

The application set above has a number of directories. The bin directory includes scripts, tools, and the suite of generation tools. The mem directory stores the memories required by the application set. The hdl directory may include subdirectories for each block in the application set, each having verilog source files of the RTL needed by the suite to further create the RTL. The sim directory contains the verification shell and the simulation environment and has several libraries. The sim directory, may, for instance, contain commercially available verification and testing to test the VERILOG or VHDL files generated. It is advantageous if the customer's requirements conform to the same verification and testing tools stored within the verification and simulation shell. The block library contains the coverage rules, the block register definitions, etc. for each of the blocks; it may also contain the code to verify the blocks. The base library contains the base code of the slice definition. The evc library contains transactors and/or monitors for each of the external chip interfaces controlled from within the integrated circuit. The tb library contain the tests or references to the tests, such as testing the application set with and without integration of the customer's requirements, test-instrumented RTL to allow gate-level testing of the entire chip. The tests to validate the shell blocks, the subsystem tests that tests the user module alone are option but use transactors as hardware interfaces. The other libraries, the rac, sta, syn contain the RTL analysis and checking, the static timing analysis, and the synthesis constraint files, respectively, for each of the blocks in the application set.

FIG. 7 is a simplified block diagram of the concept of a generation tool. Each tool may execute separately or coordinate with the other tools. Input to the suite of generation tools includes an application set 710 comprising the shells 712 and the slice definition 714. Also input to the tools is the specification of the desired final integrated circuit, the design or specification of the customer requirement 720. The customer requirement 720 for memory elements to be generated by the memory generation tool may specify the bit width and depth of the desired memory, number of read/write ports, cycle time, number of cycles, physical location of the logic interface, power restrictions. For the tool that generates the I/O functions for an integrated circuit, the design specification includes a description of the required I/O buffers, and inter alia, such details as: (a) the direction of the dataflow—whether in, out or bidirectional; (b) whether the terminator is single-ended or differential; (c) the direct current (DC) characteristics such as voltage level and drive strength; (d) the alternating current (AC) performance characteristics such as frequency; (e) the type of I/O, e.g., LVTTL, CMOS, Three State, etc.; (f) the logic affinity; (g) the I/O grouping categories by bus or skew/line length. One of skill in the art will understand that different functions to be implemented on the integrated circuit will require different specifications; thus, the above examples of memory and I/O requirements is not intended to be limitative.

Implementation of the generation process can be partitioned into separate processes, one for each tool 730 of the suite. Each of the generation tools 730 preferably has a manager 732, a resource allocation database 734 which may be separate or shared amongst the tools, a resource selector 736, and a composer 738. The manager 732 has several functions, it (a) maintains the overall set of elements and logic resources, i.e., the state generated by any previous generated designs; (b) receives new requests for additions, changes, or deletions to the set of generated elements; (c) interprets requests for additions and changes and instructs the resource selector 736 to provide a list of available elements which can be used to construct the requested circuit; (d) updates the resource database 734 with the complete view of generated elements for use in further optimization passes; and (e) manages the overall efficiency of the entire of generated elements by building sets of metrics based on the generation order and contributing in the generation reordering process. The manager 732 further maintains the request order of the elements to be constructed, the physical placement detail of the customer logic from the design database 784, the partitioning of the elements, the characteristics of the combined elements, such as memory, power consumption, and any customer restrictions or "sticks" on element allocation.

The resource selector 736 receives commands one of which may include the current customer requirement 720 for a particular element from the manager 732. The resource selector 736 references the slice definition 714 and the resource database 734, and in one embodiment has context only for the current requested element but in another embodiment may have context for the entire set of previously generated elements. In another embodiment, however, it is possible for the resource selector 736 to take on more of the global optimization task to view multiple customer requirements; otherwise global tasks may be managed by the manager 732. When selecting the elements needed for a particular block, circuit or function, the resource manager 736 considers, inter alia, (a) available elements vs. generated elements; (b) performance and organization of the available elements and technology characteristics; (c) design margin; and (d) physical location of the elements with respect to the RTL connected to it. The resource selector 736 performs a local optimization across a weighting of the parameters and builds a list of elements to support the requested design. If the requested design cannot be constructed from available resources the result is passed to the manager 732 for communication.

Once the resource manager 732 has selected the candidate elements, these elements along with the customer requirement 720 are passed to the composer 738. The composer 738 generates the design views 750, i.e., the RTL, simulation array, timing constraints, synthesis scripts, for the requested design, which may be in Verilog, VHDL, or other design language selected. The composer 738 also informs the manager 732 if it is not possible to create the requested resource from the particular slice.

The design integrator 782 takes the design views 750 for the requested elements and stitches them into the overall chip design held in the design database 784. The design qualifier 786 is an RTL or netlist qualification tool that determines, inter alia: (a) whether the design is likely to meet timing under a set of design margin or technology assumptions; (b) the power consumption contribution of the several elements and their function to the design; (c) whether power plane limitations are observed; (d) whether placement of the elements is commensurate with associated logic affinities; and (e) whether the skew specifications are within tolerance. Once the requested circuits have been constructed, integrated, and qualified in the design views 750, the manager 732 updates the resource database 734 with the exact details of the constructed elements and proceeds with the next iteration of the process.

It is critical that those skilled in the art appreciate the power of the suite of generation tools described herein. Not only can the suite generate design views of an integrated circuit given an application set, the suite also generates the slice description that can be used within an application set. The slice or any other partially manufactured semiconductor chip, moreover, then can be further developed by the suite and methodology of generation tools described herein.

One of skill in the art will appreciate the versatility proffered by the suite of generation tools in that the suite can undergo a global optimization. The suite of tools can also generate, analyze, and verify incremental changes to the design. Integrated circuit design and qualification are tasks of varying degrees of precision and accuracy. In the beginning of a design, the designer may wish to bypass the composer 738 and the design integrator 782 simply because the designer is experimenting and there may not be sufficient detail to warrant the tasks or because of time constraints, whereas late in the design process high precision and accuracy are desired to prove product quality. Alternatively, the design qualifier 786 can be run at an abstracted level, e.g., the designer may specify only I/O names, direction and types, to understand how the design will fit within certain slice or package constraints and if the design will provide the anticipated performance. In this planning process the designer could allow more or less margin to test the sensitivity of the slice resources in satisfying the requirements. The design views 750 may be modified in an iterative and incremental fashion to facilitate design exploration in all phases of the design process, and to implement incremental changes to a block and view the changes resulting from that change. The previous states of the blocks may be stored in the resource allocation database 734 or the design database 784. As the design becomes more complete or as additional information becomes known about the chip layout and associated board design, the designer may wish to specify or generate more information concerning logic affinity, performance, and grouping. As the design nears completion, a more exhaustive specification and a global optimization can be made to gain assurance that the final product will match desired outcomes.

FIGS. 8a and 8b are flow charts of the process by with the suite of generation tools can be used to generate an application set and, thereafter using the generated application set, to generate an integrated chip according to the customer's specification. At block 810, a functional specification 812 for the creation of an application set, or given an application set, the customer requirements 520 are input into the process. At step 816, RTL coding occurs. At step 818, the coded RTL is analyzed, such as by TERAFORM. If the RTL has been properly coded and conditioned by, e.g., GenReg as in block 510r, it passes the test at block 820 to create the user module 420.

In the meantime, the suite of generation tools 510 has been generating the generated module 410. First, GenReg 510r may optionally condition the specification and/or customer requirements and applies the conditioned code to input tables 830. The input tables 830 are also applied to the suite of generation tools 510 which comprises GenI/O 510io, GenMem 510m, GenClock 510c, GenTest 510t; and optionally may comprise GenTrace 510tr and GenReg 510r. It would be advantageous to have all the tools generated the generated module 410, but not all tools will be used in all situations, e.g., if no memory will be generated then GenMem would not be required to be included in the suite or if included in the suite, may not be used. If a previous state 530 of the tool(s) had been saved, it would also be considered by its respective tool. Each tool then takes as input the tables 830 and the state 530 to generate correct RTL code. If the RTL for the customer requirement 520 can't be generated given the functional specification 812 of the slice, as posed in block 834, then the process continues to block 836 to let the designer know to either change the slice description chosen or to modify the customer requirement. If the resource can be generated from the transistor fabric of the slice description of the application set, the suite of tools generates the RTL logic in step 840. The synthesized RTL 840 and the proven logic of the fixed module 430 and the top module 450 are input into the design qualifier 786 of FIG. 8b. Also inputs to the design qualifier 786 are the various outputs from each of the tools. Each of the suite of generation tools then provide its respective design view to the design qualifier 786 for further evaluation.

The design qualifier 786 then checks the design views output from each of the tools. Each of the tools, moreover, provides a basis for testing within the design qualifier 786. The RTL is analyzed in block 818. A series of simulated functional tests are performed on the logic to verify the correct functionality, as executed by the verification shell 852. The manufacturing test shell 854 validates that appropriate tests patterns and high test coverage using tests such as JTAG, boundary scans, etc., of the intended semiconductor product or a portion can be realized, as in block 854. Static timing analysis is checked for proper arrival and interval of clock and signal inputs to the gates, as in block 856. If any of these shells indicate that the generated RTL does not pass muster, as in blocks 820, an error message is flagged for the designer to review either or both the functional specification 812 and the customer requirement 520. The synthesis shell 858 and the floorplan shell 860 provide input to the static timing analysis shell 856. The documentation shell 862 is provided as output.

If additional resources are to be added, or if another iteration might be undertaken to change the placement and or logic or consider other factors, such as in block 880, the process loops back up to the input of the functional specification 812 and the customer requirement 520. Such additional factors to consider might be changing an I/O buffer or increasing the clock frequency. These changes may be considered incrementally by another iteration of the process.

Not only is a chip created using the tools described herein designed and tested for efficient placement of the blocks with respect to each, but also with respect to connection of the chip onto a board. FIG. 9 illustrates the routing of the I/O interconnects between a chip 910 and the board 920 to which the chip is mounted or connected. One member of the suite, the I/O generation tool in conjunction with the floorplanning shell optimizes placement and timing of the powerplanes, the control signals, the data coming into and exiting the chip by anticipating important design factors such as differential switching, multiple voltages, and controlled impedance. As shown in the color illustration of FIG. 9, the clock and PLL locations are optimized to enhance performance and facilitate electrostatic discharge protection as may be shown by the, e.g., sky blue color labeled 930. The control voltage and signal ground may be represented by another power split 940 and color, and the I/O signals still represented by another color and power split 950. FIG. 9 is illustrative only, there may be more or fewer power splits which may be arranged differently within and around the chip 910 for optimization depending upon the application set and function of the chip. This feature of the invention is particularly useful when a chip designer has a sample or a reference board to which the chip win be mounted; otherwise this feature encourages discussion to optimize the system on a chip concept.

Thus, the suite of generation tools produces design views with generated logic and integrates the generated logic into the design. Based on the specification of the desired integrated circuit, the slice definition, the shells, and the current state of the resource usage, the set of generation tools updates the generated RTL and the resource state. Using the resources state in the methodology allows the tools to support incremental updates without surprise, usually adverse, effects. The methodology also supports wholesale, optimized updates when resources run low. The suite of tools and the methodology as described herein can also qualify the generated RTL in the context of the entire design state upon incremental or wholesale updates. The generation technology herein ensures the correct levels of documentation and design, as well as provides coherency checking between the documentation and the design database. If a register or memory has been added to the RTL but does not exist in the design documentation, the tool of the generation tool suite flags this to the design engineer who then has the capability to update either the RTL or documentation.

The numerous advantages of the suite of generation tools make it attractive to technical writers, chip designers, and firmware engineers. Less time is spent on tedious tasks such as documentation updates, individual register RTL coding, and firmware header file development. There are fewer errors in documentation and design. The automatic verification testcase generation ensures simulation coverage of RTL. The design is scalable with registers inserted and connected into a hierarchical design. A coherency check automatically updates either specification or RTL if there is a mismatch between design and specification. Releases of the design and documentation may be managed using an off-the-shelf source control tool.

While the description provides embodiments of the invention, the embodiments are considered illustrative and by way of example only and are not intended to be limitative. Rather, the invention is as claimed is:

What is claimed is:

1. A suite of generation tools to generate a plurality of design views of a semiconductor chip, each of the generation tools comprising: (a) a manager whose input comprises available physical and logical resources and a desired chip specification; (b) a resource allocation database interfacing with the manager to inventory what physical and logical resources have been used to create design views of the desired chip specification and what physical and logical resources remain available; (c) a resource selector to interact with the manager and resource allocation database to select available physical and logical resources to create the design views; and (d) a composer, interactive with the resource selector, which generates the design views.

2. The suite of generation tools as in claim 1, wherein the resource allocation database stores an incremental state of design views.

3. The suite of generation tools as in claim 1, wherein the resource selector considers any constraints within the desired chip specification.

4. The suite of generation tools of claim 1, wherein the available resources comprise a definition of a slice having at least a transistor fabric.

5. The suite of generation tools of claim 4, wherein the slice definition further comprises at least one hardmac.

6. The suite of generation tools of claim 5, wherein the hardmac is at least one I/O transceiver.

7. The suite of generation tools of claim 4, wherein the slice definition further comprises at least one IP core.

8. The suite of generation tools of claim 5, wherein the hardmac is at least one diffused memory.

9. The suite of generation tools of claim 5, wherein the hardmac is at least one phase locked loop for timing of the semiconductor chip.

10. The suite of generation tools of claim 4, further comprising a configurable I/O as a control interface.

11. The suite of generation tools of claim 4, further comprising a configurable I/O as an interface for configuration of blocks and the transistor fabric.

12. The suite of generation tools of claim 4, further comprising a configurable I/O as a test interface.

13. The suite of generation tools of claim 12, wherein the test interface is a JTAG test interface.

14. The suite of generation tools of claim 4, wherein the logical resources further comprising a plurality of shells to test and quality the design views and generate a qualified netlist.

15. The suite of generation tools of claim 14, wherein the plurality of shells comprise an RTL shell, a static timing analysis shell, a verification shell, a manufacturing test shell, a floorplan shell, a documentation shell, and a synthesis shell, each of the plurality of shells to interact with the physical resources of the slice and the customer requirement to create the semiconductor chip.

16. The suite of generation tools as in claim 14, wherein the design views are in Verilog.

17. The suite of generation tools as in claim 14, wherein the design views are in VHDL.

18. The suite of generation tools of claim 4, wherein the suite comprises one or more of the following: a memory generator, an I/O generator, a clock generator, and a test generator.

19. The suite of generation tools of claim 18, further comprising a tool that automatically documents, implements, and tests at least one internal memory and/or register.

20. The suite of generation tools of claim 18, further comprising a tool to configure unused resources for at least one trace array where state and debug signals can be input for logic analysis and trace storage.

21. The suite of generation tools of claim 4, further comprising: a design integrator, a design database, and a design qualifier to interact with the manager of each tool and to verify and test the design views generated by each tool.

22. The suite of generation tools of claim 21, wherein design database holds a state of incremental design views generated by the suite of generation tools.

23. The suite of generation tools of claim 21, wherein the design database holds a state of the slice description, customer requirement, and any generated design views of the semiconductor chip.

* * * * *